United States Patent
Sakai et al.

(10) Patent No.: US 7,923,900 B2
(45) Date of Patent: Apr. 12, 2011

(54) ULTRASONIC MOTOR

(75) Inventors: Nagahide Sakai, Higashimurayama (JP); Hiromichi Sakano, Fuchu (JP); Tomoki Funakubo, Tama (JP); Morimiti Simizu, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 12/640,392

(22) Filed: Dec. 17, 2009

(65) Prior Publication Data

US 2010/0096948 A1    Apr. 22, 2010

Related U.S. Application Data

(63) Continuation of application No. PCT/JP2008/061258, filed on Jun. 19, 2008.

(30) Foreign Application Priority Data

Jun. 27, 2007  (JP) ................................. 2007-169517

(51) Int. Cl.
*H02N 2/00* (2006.01)

(52) U.S. Cl. ......... 310/323.16; 310/323.02; 310/323.17; 310/366

(58) Field of Classification Search ............ 310/323.02, 310/323.16, 323.17, 366
See application file for complete search history.

(56) References Cited

U.S. PATENT DOCUMENTS

| | | | | |
|---|---|---|---|---|
| 3,781,577 A | * | 12/1973 | Nonaka et al. | 310/365 |
| 7,215,062 B1 | * | 5/2007 | Iino et al. | 310/323.02 |
| 2010/0019621 A1 | * | 1/2010 | Funakubo et al. | 310/323.16 |

FOREIGN PATENT DOCUMENTS

| | | |
|---|---|---|
| JP | 9-135586 | 5/1997 |
| JP | 10-341580 | 12/1998 |
| JP | 2000-102267 | 4/2000 |
| JP | 2005-65358 | 3/2005 |
| JP | 2006-311647 | 11/2006 |

OTHER PUBLICATIONS

International Search Report dated Aug. 12, 2008.

* cited by examiner

*Primary Examiner* — Thomas M Dougherty
(74) *Attorney, Agent, or Firm* — Scully, Scott, Murphy & Presser, P.C.

(57) ABSTRACT

An ultrasonic motor, which drives a driven member using an elliptical vibration produced by synthesizing a longitudinal vibrational mode and a flexural vibrational mode as a drive force, is configured as follows. Namely, the ultrasonic motor includes a piezoelectric device, and a feed member feeding the piezoelectric device. An extensional axis of the feed member is set to an axis different from main vibrational axes of the longitudinal vibrational mode and the flexural vibrational mode.

10 Claims, 4 Drawing Sheets

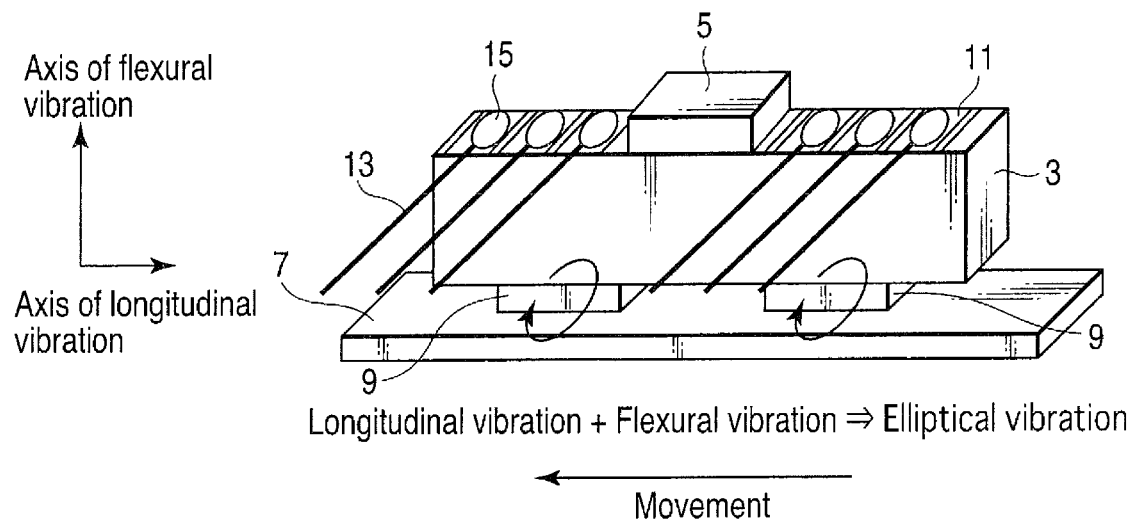
F I G. 1
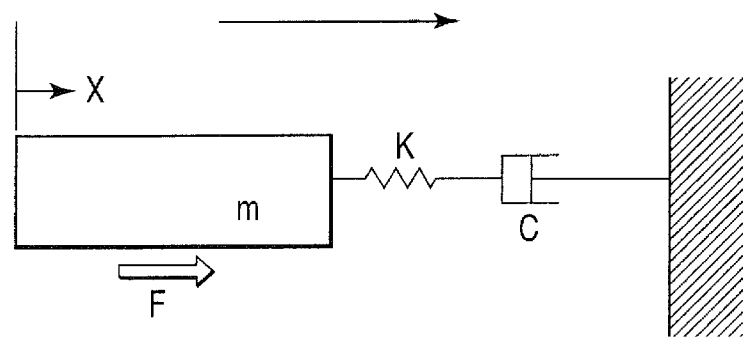
F I G. 2

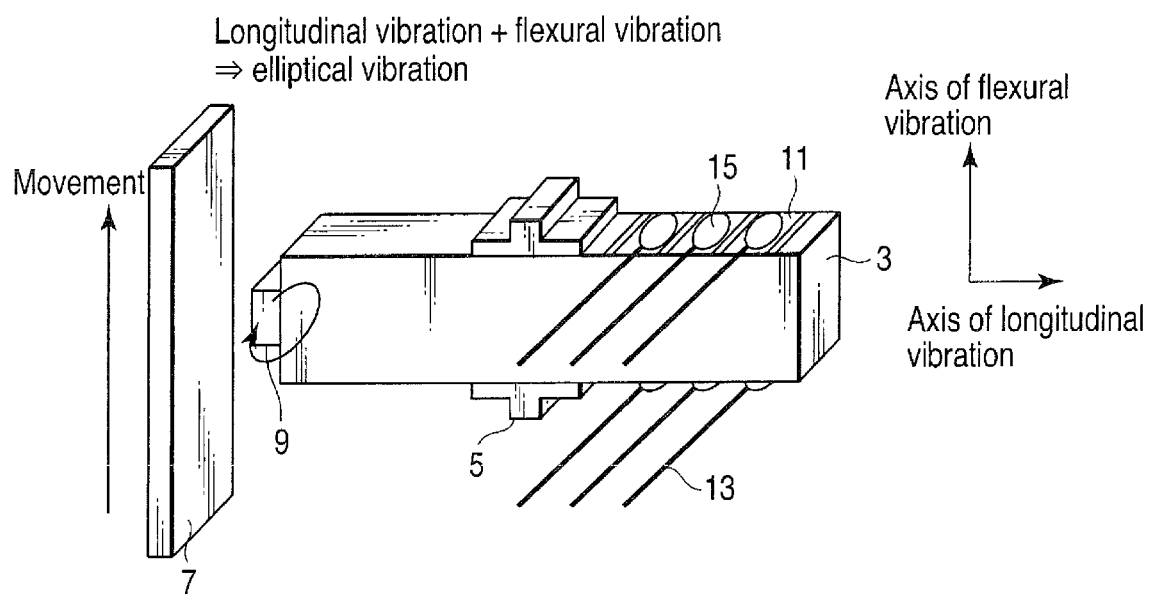
F I G. 7

ULTRASONIC MOTOR

CROSS REFERENCE TO RELATED APPLICATIONS

This is a Continuation Application of PCT Application No. PCT/JP2008/061258, filed Jun. 19, 2008, which was published under PCT Article 21(2) in Japanese.

This application is based upon and claims the benefit of priority from prior Japanese Patent Application No. 2007-169517, filed Jun. 27, 2007, the entire contents of which are incorporated herein by reference.

BACKGROUND OF THE INVENTION

1. Field of the Invention

The present invention relates to an ultrasonic motor.

2. Description of the Related Art

Recently, a small-size, high-torque, long-stroke and high-resolution ultrasonic motor has been frequently used compared with an electromagnetic motor. For example, Jpn. Pat. Appln. KOKAI Publication No. 2005-65358 discloses an ultrasonic motor using a stacked piezoelectric device as the foregoing ultrasonic motor.

Specifically, in order to realize high efficiency, the ultrasonic motor disclosed in the foregoing Publication No. 2005-65358 is provided with an external electrode, which short-circuits an internal electrode. The external electrode is located on both ends (that is, two surfaces) of the longitudinal axis in the stacked piezoelectric device to avoid the vicinity of the middle of flexural vibration in a stacked piezoelectric device.

BRIEF SUMMARY OF THE INVENTION

However, the position provided with the external electrode corresponds to the middle of longitudinal vibration in a stacked piezoelectric device.

Further, the ultrasonic motor disclosed in the foregoing Publication No. 2005-65358 has no consideration to a reduction of efficiency resulting from wirings of a stacked piezoelectric device. Therefore, the Publication No. 2005-65358 has neither disclosure nor suggestion related to the following technique. Namely, the technique is to prevent a vibrational loss, that is, reduction of efficiency resulting from a wiring method of a feed member for feeding the foregoing internal and external electrodes.

The present invention has been made in view of the foregoing circumstances. An object of the invention is to provide a high-efficiency ultrasonic motor, which can prevent a vibrational loss resulting from a feed member.

In order to achieve the foregoing object, according to a first aspect of the present invention, there is provided an ultrasonic motor, which drives a driven member using an elliptical vibration produced by synthesizing a longitudinal vibrational mode and a flexural vibrational mode as a drive force, comprising: a piezoelectric device; and a feed member feeding the piezoelectric device; wherein an extensional axis of the feed member is set to an axis different from main vibrational axes of the longitudinal vibrational mode and the flexural vibrational mode.

BRIEF DESCRIPTION OF THE SEVERAL VIEWS OF THE DRAWING

FIG. 1 is a view showing the structure of an ultrasonic motor according to one embodiment of the present invention;

FIG. 2 is a view showing a model of an ultrasonic motor according to one embodiment of the present invention using an equivalent mass m related to displacement of a piezoelectric device near a drive force output member, a force F produced by a vibration of the piezoelectric device near the drive force output member, loads K and C by a feed member;

FIG. 7 is a view showing a modification example of the structure of the ultrasonic motor shown in FIG. 1.

DETAILED DESCRIPTION OF THE INVENTION

Figure 3A:
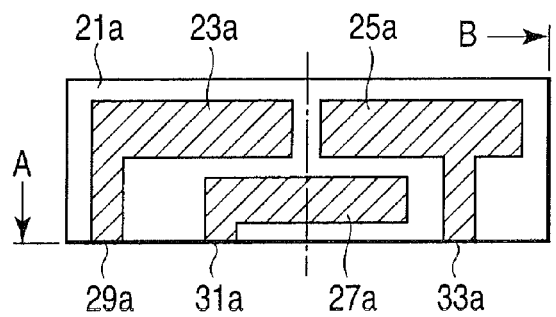
FIG. 3A is a view showing one configuration example of a piezoelectric material forming the piezoelectric device 3.

An ultrasonic motor according to one embodiment of the present invention will be hereinafter described with reference to the accompanying drawings.

FIG. 1 is a view showing the structure of an ultrasonic motor according to one embodiment of the present invention. As seen from FIG. 1, the ultrasonic motor includes a piezoelectric device 3, a holding member 5 of the piezoelectric device 3, a driven member 7, a drive force output member 9, an external electrode 11 of the piezoelectric device 3 and a feed member 13. In this case, the drive force output member 9 obtains a drive force from elliptical vibration (described later) in the piezoelectric device 3 to drive the driven member 7. The feed member 13 comprises a lead wire for feeding the piezoelectric device 3, for example.

The piezoelectric device 3 held by the holding member 5 contacts the driven member 7 to vertically apply a pressure force to the driven member 7 via the drive force output member 9.

When two alternating signals having a phase difference are applied to the external electrode of the piezoelectric device 3 via the feed member 13, elliptical vibration synthesizing a longitudinal vibrational mode and a flexural vibrational mode is produced in the piezoelectric device 3.

Of course, the drive force output member 9 attached to the piezoelectric device 3 produces the same elliptical vibration as the piezoelectric device 3. The foregoing elliptical vibration of the drive force output member 9 drives the driven member 7 contacting the drive force output member 9 as described above.

The foregoing external electrode 11 and feed member 13 are essentially constituent members for driving an ultrasonic motor. However, the feed member 13 also functions as a load, which damps the vibration of the piezoelectric device 3. In other words, the feed member 13 is a factor in reducing the efficiency of the ultrasonic motor in comparison with the conventional case.

Specifically, for example, if the extensional axis of the feed member 13 coincides with the axis of longitudinal or flexural vibration of the piezoelectric device 3, vibrational loss of the piezoelectric device remarkably appears.

FIG. 2 is a view showing a model of the ultrasonic motor shown in FIG. 1 using an equivalent mass m related to displacement near the drive force output member 9, a force F produced by a vibration near the drive force output member 9, load coefficients K and C showing a load by the feed member 13.

In this case, a motion formula of the vibrational axis near the drive force output member 9 is expressed by the following formula.

$$m\ddot{X}=F-KX-C\dot{X} \quad \text{(Formula 1)}$$

The foregoing load coefficients K and C are determined depending on the extensional axis, kind, size, soldering method of the feed member and a distance to the drive force output member 9. The displacement X express displacement to the main displacement axis near the drive force output member 9.

The foregoing force F produced by the piezoelectric effect of the piezoelectric device 3 is constant; therefore, the foregoing (Formula 1) is expressed by the following formula.

$$m\ddot{X}=(const)-(KX+C\dot{X}) \quad \text{(Formula 2)}$$

In this case, the extensional axis of the feed member 13 is set independently of the vibrational axis X shown in FIG. 2. In this way, K and C values of the foregoing (Formula 2) can be made small. Namely, the extensional axis of the feed member 13 is set independently of the foregoing vibrational axis X without changing a design of the piezoelectric device 3 and a method of manufacturing the same. This serves to realize a high-efficiency ultrasonic motor, which reduces vibrational loss by the feed member 13.

The vibrational axis X of the model described referring to FIG. 2 can be regarded as both axes of longitudinal and flexural vibration of the piezoelectric device 3. Namely, the model described referring to FIG. 2 is a generalized model applicable to both longitudinal and flexural vibrations of the piezoelectric device 3.

Therefore, the extensional axis of the feed member 13 is set to the axis independent of both longitudinal and flexural vibrations of the piezoelectric device 3. In this way, it is possible to greatly reduce a vibrational loss by the feed member 13. Specifically, the extensional axis of the feed member 13 is preferably set to an axis made by an angle of 90° to the axes of longitudinal and flexural vibration of the piezoelectric device 3.

The smaller the vibrational loss by the feed member 13 is, the larger vibrational acceleration near the drive force output member 9 becomes. In other words, a more high-efficiency ultrasonic motor can be provided.

The detailed configuration of an ultrasonic motor according to one embodiment of the present invention will be described below with reference to FIGS. 3 and 4.

Figure 3B:
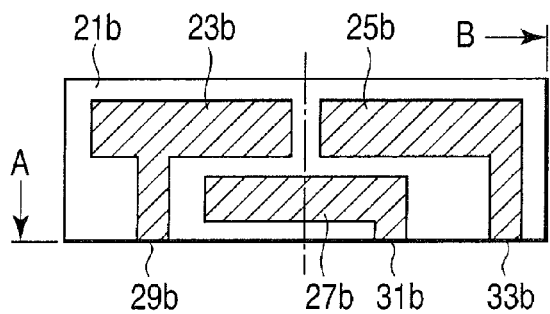
FIG. 3B is a view showing one configuration example of a piezoelectric material forming the piezoelectric device 3.

FIGS. 3A and 3B are views showing one configuration example of a piezoelectric material forming the piezoelectric device 3. According to this embodiment, the piezoelectric device 3 is configured in such a manner that a plurality of piezoelectric materials 21a shown in FIG. 3A and piezoelectric materials 21b shown in FIG. 3B are alternately stacked and sintered.

As shown in FIG. 3A, the piezoelectric material 21a is formed with three internal electrodes 23a, 25a and 27a at its surface. These internal electrodes are extended toward the same longer side (side A) of the rectangular piezoelectric material 21a. Further, the piezoelectric material 21a has exposed portions 29a, 31a and 33a to the outer periphery.

Likewise, as shown in FIG. 3B, the piezoelectric material 21b is formed with three internal electrodes 23b, 25b and 27b at its surface. These internal electrodes are extended toward the same longer side (side A) of the rectangular piezoelectric material 21b. Further, the piezoelectric material 21b has exposed portions 29b, 31b and 33b to the outer periphery.

Internal electrodes 23a, 25a and 27a of the piezoelectric material 21a and internal electrodes 23b, 25b and 27b of the piezoelectric material 21b have the following configuration. Specifically, when a plurality of piezoelectric materials 21a and 21b is alternately stacked, the foregoing internal electrodes 23a, 25a and 27a and internal electrodes 23b, 25b and 27b are arranged so that they are overlapped corresponding to each other (see FIG. 4 described later).

On the other hand, exposed portions 29a, 31a and 33a of the piezoelectric material 21a and exposed portions 29b, 31b and 33b of the piezoelectric material 21b have the following configuration. Specifically, when a plurality of piezoelectric materials 21a and 21b is alternately stacked, the foregoing exposed portions 29a, 31a and 33a and exposed portions 29b, 31b and 33b are arranged so that they are not overlapped (all exposed portions are not overlapped) (see FIG. 4 described later).

For example, zirconic/titanic acid lead is used as the foregoing piezoelectric materials 21a and 21b. The vertical thickness on the paper of piezoelectric materials 21a and 21b is set to an arbitrary range from about 10 to 200 μm.

For example, a conductive material having a high melting point such as sliver palladium durable to temperature used for sintering piezoelectric materials is used as the material of internal electrodes 23a, 25a and 27a and internal electrodes 23b, 25b and 27b.

Figure 4:
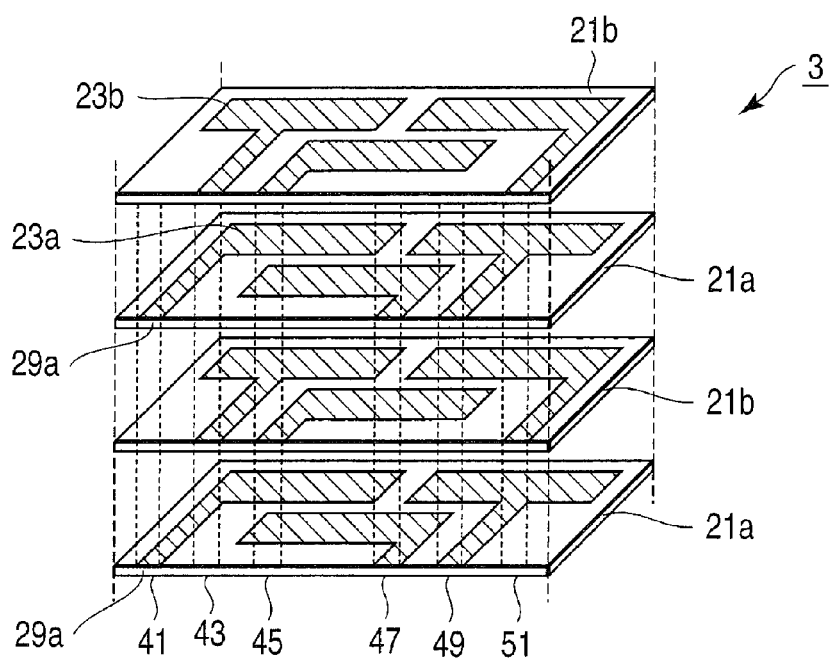
FIG. 4 is a schematic view showing one stacked example when a plurality of piezoelectric materials shown in FIGS. 3A and 3B are and sintered.

FIG. 4 is a schematic view showing a stacking example when a plurality of piezoelectric materials 21a and 21b shown in FIG. 3 is alternately stacked and sintered. As seen from FIG. 4, the foregoing piezoelectric materials 21a and 21b are alternately stacked and sintered, and thereafter, exposed portions 29a are short-circuited each other to form an external electrode 41. Likewise, exposed portions 31a, 33a, 29b, 31b and 33b are short-circuited each other to form external electrodes 43, 45, 47, 49 and 51, respectively.

In this case, conductive materials such as silver palladium or silver having a thickness of 10 μm are used as the material for the foregoing external electrodes 41, 43, 47, 49 and 51.

For example, polarization is performed between the foregoing external electrodes 41 and 43, and thereby, a common area in the stacked direction, that is, internal electrodes 23a and 23b only are formed as a piezoelectric active area. In this case, an alternating signal is applied between external electrodes 41 and 43, and thereby, a vibration is produced in the piezoelectric device 3.

Likewise, for example, polarization is performed between the foregoing external electrodes 45 and 47, and thereby, a common area in the stacked direction, that is, internal electrodes 27a and 27b only are formed as a piezoelectric active area. In this case, an alternating signal is applied between external electrodes 45 and 47 and thereby, a vibration is produced in the piezoelectric device 3. Further, likewise, for example, polarization is performed between the foregoing external electrodes 49 and 51 and thereby, a common area in the stacked direction, that is, internal electrodes 25a and 25b only are formed as a piezoelectric active area. In this case, an alternating signal is applied between external electrodes 49 and 51 and thereby, a vibration is produced in the piezoelectric device 3.

The foregoing active area formed of internal electrodes 23a and 23b and the foregoing active area formed of internal electrodes 25a and 25b are used when longitudinal vibration and flexural vibration are simultaneously induced in the piezoelectric device 3 or when flexural vibration only is induced. On the other hand, the foregoing active area formed of internal electrodes 27a and 27b is used for inducing a longitudinal vibration in the piezoelectric device 3 or detecting the vibrational state of the piezoelectric device 3.

The foregoing polarization is the option in its axis. In other words, in the same piezoelectric material, the polarization axis is not the same in the piezoelectric active areas between internal electrodes 23a and 23b and between internal electrodes 25a and 25b. In addition, a sheet of stacked piezoelectric materials 21a and 21b is the option.

Figure 5:
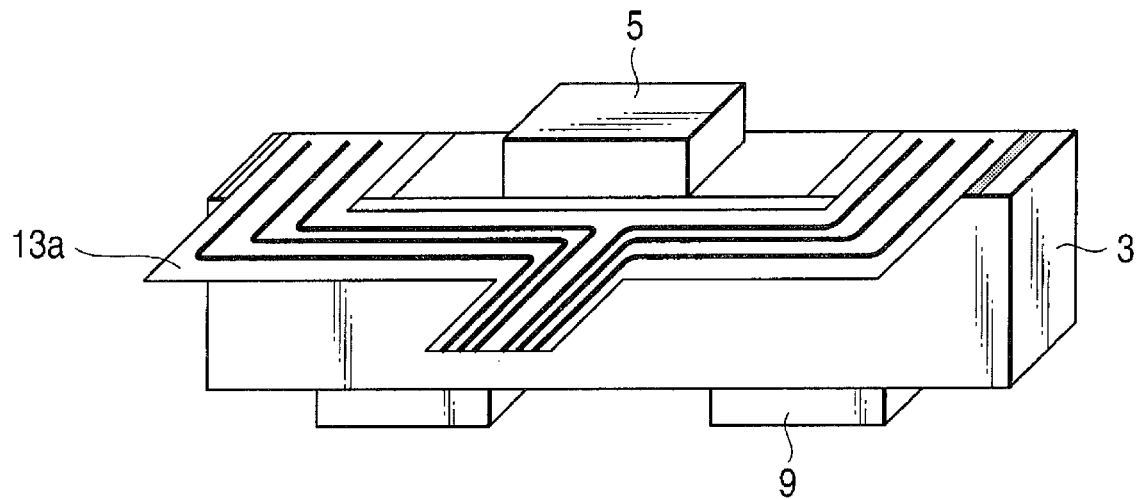
FIG. 5 is a view showing a piezoelectric device connecting a hold member, a drive force output member and a feed member.

FIG. 5 is a view showing a piezoelectric device 3 connecting a holding member 5, a drive force output member 9 and a feed member 13a.

As can be seen from the feed member 13a illustrated in FIG. 5, for example, connection wires from several external electrodes are collected on one feed member 13a using a flexible printed board. In this way, the number of members is reduced, and the connection process of the feed member 13a is simplified. The foregoing flexible printed board and the external electrode 11 are connected by means of thermal pressure using a conductive bonding agent, for example. The flexible printed board is relatively light; therefore, the effect of reducing a vibrational loss is great compared with the case of welding a lead wire to an external electrode.

As described above, according to this embodiment, it is possible to realize a high-efficiency ultrasonic motor, which prevents a vibrational loss resulting from a fee member.

Specifically, the extensional axis of the feed member 13 is set to an axis independent of the longitudinal and flexural vibrational axes. In this way, it is possible to reduce a vibrational loss resulting from the feed member 13 as can be seen from a graph shown in FIG. 6.

Figure 6:
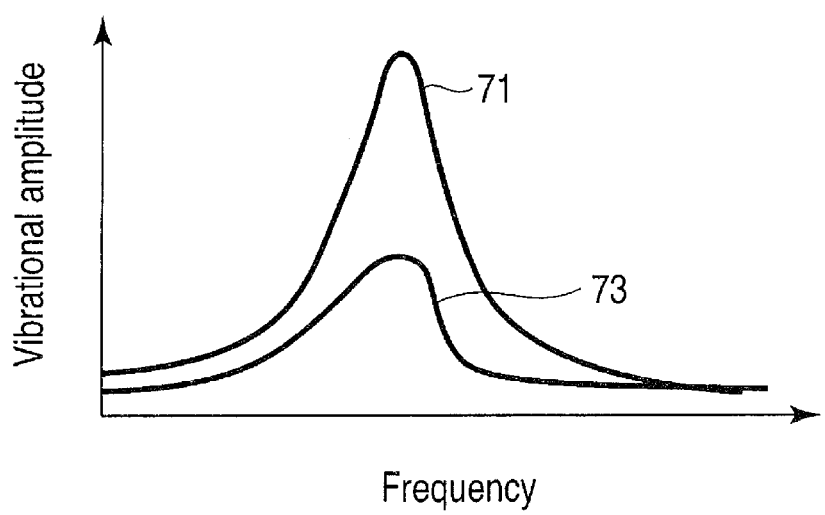
FIG. 6 is a graph taking vibrational amplitude of a piezoelectric device as the vertical axis and taking a vibrational frequency of a piezoelectric device as the horizontal axis.

FIG. 6 is a graph taking vibrational amplitude of a piezoelectric device 3 as the vertical axis, and taking a vibrational frequency thereof as the horizontal axis. In the graph of FIG. 6, a characteristic curve 71 is a characteristic curve of an ultrasonic motor according to one embodiment. On the other hand, a characteristic curve 73 is a characteristic curve of a conventional ultrasonic motor (Namely, the extensional axis of a feed member coincides with the longitudinal vibrational or flexural vibrational axis of a piezoelectric device 3).

Specifically, in the ultrasonic motor according to one embodiment, the extensional axis of the feed member 13 is set to an axis independent of the longitudinal vibrational and flexural vibrational axes of a piezoelectric device 3. In this case, as seen from the characteristic curve 71, it is possible to achieve a preferable drive efficiency reducing a vibrational amplitude loss.

In this way, the ultrasonic motor according to this embodiment can reduce a vibrational loss resulting from the feed member to improve a drive efficiency.

According to one embodiment, a vibrational loss resulting from the feed member can be reduced as described above. Therefore, the feed member 13 and external electrodes 41, 43, 45, 49 and 51 are located at a position corresponding to the middle of the piezoelectric device 3. This serves to provide an ultrasonic motor having a high freedom of design without limiting located places of the feed member 13 and external electrodes 41, 43, 45, 49 and 51.

The present invention has been described based on the foregoing one embodiment. However, the present invention is not limited to the foregoing embodiment. Off course, various modifications and applications are possible within the scope of the invention.

FIG. 7 is a view showing one modification example of the structure of the ultrasonic motor shown in FIG. 1.

As described above, according to the example shown in FIG. 1, the longitudinal vibrational axis of the piezoelectric device 3 and the driving axis of the driven member 7 are the same. On the other hand, according to the example shown in FIG. 7, the flexural vibrational axis of the piezoelectric device 3 and the driving axis of the driven member 7 are the same.

As depicted in FIG. 7, the following structure is employed, namely, the flexural vibrational axis of the piezoelectric device 3 and the driving axis of the driven member 7 are the same. Even if the foregoing structure is employed, the extensional axis of the feed member 13 is set to an axis different from the longitudinal and flexural vibrations as in the case of the structure shown in FIG. 1. In this way, the same effect as obtained by the structure shown in FIG. 1 is obtained.

The number of internal electrodes is set to three in one piezoelectric material according to the foregoing embodiment. Of course, two or four internal electrodes may be used. In also case, the configuration is performed like the ultrasonic motor according to the foregoing embodiment. Therefore, a space is effectively used to preferably make a proper design.

The foregoing embodiment includes various inventive steps, and various inventions are made by properly combining a plurality of disclosed constituent components. For example, even if some constituent components are deleted from all constituent components, it is possible to solve the problem described in the column "Problem that the invention is to solve". If the effect described in the column "Effect of the invention" is obtained, the configuration of deleting the constituent components is provided as the invention.

What is claimed is:

1. An ultrasonic motor, which drives a driven member using an elliptical vibration produced by synthesizing a longitudinal vibrational mode and a flexural vibrational mode as a drive force, comprising:
    a piezoelectric device; and
    a feed member feeding the piezoelectric device; wherein
        an extensional axis of the feed member is set to an axis different from main vibrational axes of the longitudinal vibrational mode and the flexural vibrational mode.

2. The ultrasonic motor according to claim 1, wherein the piezoelectric device is configured in such a manner that rectangular piezoelectric materials and a plurality of internal electrodes formed on the piezoelectric materials are alternately stacked.

3. The ultrasonic motor according to claim 2, wherein the internal electrodes are extended toward the same one side of the piezoelectric materials, and electrically connected to the feed member via exposed portions at the outer periphery of the piezoelectric device and external electrodes.

4. The ultrasonic motor according to claim 3, wherein the same one side is a longer side of the rectangular piezoelectric materials.

5. The ultrasonic motor according to claim 3, further including:
    a drive force output member driving the driven member using a drive force obtained from an elliptical vibration of the piezoelectric device,
    the drive force output member being located at a surface of the piezoelectric device, which surface is opposite to a surface formed with the external electrodes.

6. The ultrasonic motor according to claim 3, further including:
    a holding member for holding the piezoelectric device,
    the holding member being located on the same surface as a surface formed with the external electrodes.

7. The ultrasonic motor according to claim 1, wherein the feed member comprises a flexible printed board.

8. The ultrasonic motor according to claim 7, wherein the flexible printed board and the piezoelectric device are connected by means of a conductive bonding agent.

9. The ultrasonic motor according to claim 1, wherein the driven axis of the driven member coincides with the vibrational axis of the longitudinal vibrational mode.

10. The ultrasonic motor according to claim 1, wherein the driven axis of the driven member coincides with the vibrational axis of the flexural vibrational mode.

* * * * *